(12) United States Patent
Berrian et al.

(10) Patent No.: US 8,581,217 B2
(45) Date of Patent: Nov. 12, 2013

(54) METHOD FOR MONITORING ION IMPLANTATION

(75) Inventors: Don Berrian, Topsfield, MA (US); Cheng-Hui Shen, Hsinchu County (TW)

(73) Assignee: Advanced Ion Beam Technology, Inc., Fremont, CA (US)

( * ) Notice: Subject to any disclaimer, the term of this patent is extended or adjusted under 35 U.S.C. 154(b) by 175 days.

(21) Appl. No.: 12/900,862

(22) Filed: Oct. 8, 2010

(65) Prior Publication Data
US 2012/0085936 A1 Apr. 12, 2012

(51) Int. Cl.
*G21K 5/10* (2006.01)

(52) U.S. Cl.
USPC ............ 250/492.21; 250/492.1; 250/492.2; 250/492.23; 250/492.3

(58) Field of Classification Search
USPC ............ 250/492.1, 492.2, 492.21, 492.3, 250/492.22
See application file for complete search history.

(56) References Cited

U.S. PATENT DOCUMENTS

| | | | |
|---|---|---|---|
| 5,948,986 A | 9/1999 | Brown | |
| 6,368,887 B1* | 4/2002 | Lowrey et al. | 438/17 |
| 6,430,022 B2 | 8/2002 | Leeser | |
| 6,487,063 B1 | 11/2002 | Nakasuji | |
| 6,842,029 B2 | 1/2005 | Howland | |
| 6,851,096 B2 | 2/2005 | Alexander | |
| 6,953,942 B1* | 10/2005 | Graf et al. | 250/492.21 |
| 7,385,208 B2 | 6/2008 | Cheng et al. | |
| 7,557,361 B2* | 7/2009 | Ward et al. | 250/423 F |
| 2005/0181584 A1* | 8/2005 | Foad et al. | 250/492.2 |
| 2006/0097196 A1* | 5/2006 | Graf et al. | 250/492.21 |
| 2006/0145097 A1* | 7/2006 | Parker | 250/492.22 |
| 2006/0249696 A1* | 11/2006 | Chang et al. | 250/492.21 |
| 2007/0278428 A1* | 12/2007 | Zani et al. | 250/492.22 |
| 2008/0067438 A1* | 3/2008 | Halling | 250/492.21 |
| 2008/0078955 A1* | 4/2008 | Graf et al. | 250/492.21 |
| 2008/0078957 A1* | 4/2008 | Graf et al. | 250/492.21 |
| 2008/0142727 A1* | 6/2008 | Ryding et al. | 250/400 |
| 2009/0090876 A1* | 4/2009 | Shen et al. | 250/492.21 |
| 2009/0242808 A1* | 10/2009 | Evans | 250/492.21 |

FOREIGN PATENT DOCUMENTS

| | | |
|---|---|---|
| TW | 466533 B | 12/2001 |
| TW | 256421 B | 6/2006 |
| TW | 264063 B | 10/2006 |

* cited by examiner

*Primary Examiner* — David A Vanore
*Assistant Examiner* — Wyatt Stoffa
(74) *Attorney, Agent, or Firm* — Rosenberg, Klein & Lee

(57) ABSTRACT

A method capable of monitoring ion implantation. First, an ion beam and a workpiece are provided. Next, implant the workpiece by the ion beam and generate a profile having numerous signals relevant to respectively numerous relative positions between the ion beam and the workpiece, wherein the profile has at least a higher portion, a gradual portion and a lower portion. Therefore, by directly analyzing the profile without referring to a pre-determined profile and without using a profiler measuring the ion beam, some ion beam information may be acquired, such as beam height, beam width, ion beam current distribution on the ion beam cross-section, and so on, and the ion implantation may be monitored real-timely. Furthermore, when numerous workpieces are implanted in sequence, the profile(s) of one or more initially implanted workpiece(s) may be to generate a reference for calibrating the ion implantation of the following workpieces.

18 Claims, 10 Drawing Sheets

METHOD FOR MONITORING ION IMPLANTATION

FIELD OF THE INVENTION

The present invention generally relates to ion implantation, and more particularly to a method for real-timely monitoring ion implantation.

DESCRIPTION OF THE RELATED ART

Ion implantation is a very important technique in the manufacture of integrated circuit, memory, flat plan display, solar cell, and so on. The accuracy of performing the ion implantation influences on final yielding rate of the manufacture significantly. In general, the ion implantation is performed by making a relative motion between an ion beam and a workpiece, such as wafer and glass plate, and then the ion implantation result is inaccurate if the projection of the ion beam on the workpiece and/or the relative motion between the ion beam and the wafer is not qualified enough. Hence, it is important to monitor how the workpiece is implanted by the ion beam.

Some conventional approaches are popularly used for monitoring the ion beam. One conventional approach is monitoring an ion beam when the ion beam is projected into a Faraday cup before or after scanning the ion beam through a workpiece. However, the ion beam is not monitored during an implantation period of scanning the workpiece by the ion beam, and then the variation on the ion beam during the implantation period can not be monitored. Another conventional approach is inferring the ion beam by analyzing a distribution of ions implanted in the workpiece after finishing an implantation. Clearly, the ion beam still is not monitored real-timely. Still another conventional approach is monitoring an ion beam from one or more Faraday cups close to, such as located behind, the workpiece, so that at least partial ion beam not implanted into the workpiece may be monitored by the Faraday cup during the period of scanning the workpiece by the ion beam. And then, the measured profile is compared with a pre-determined profile to monitor the variation of the ion beam during the scanning period. Herein, the difference between the measured profile and the pre-determined profile may indicate the quality of the practical ion implantation on the workpiece by the ion beam. The approach is somewhat real-timely than previous approaches, but no more ion beam message may be acquired from the measured profile. One more conventional approach is using a profiler to measure the ion beam during a beam turning period, so that some ion beam geometric messages may be acquired before the workpiece being implanted by the ion beam. For example, the ion beam shape, the ion beam height, the ion beam width and the ion beam center. This approach is more accurate owing to the function of the profile, but still can not real-timely monitor the ion beam. Besides, all these conventional approaches only can monitor whether the ion beam quality, at most provide some messages of the ion beam, but none can be used to tune the ion implantation during the implantation period.

Accordingly, there is a need for having approach for more real-timely monitoring the ion beam, even for acquiring more ion beam message and tuning the ion implantation during the implantation period.

SUMMARY OF THE INVENTION

The present invention is directed to a method for monitoring ion implantation much real-timely by monitoring a profile having numerous signals respectively relevant to numerous relative positions between the ion beam and the workpiece. Moreover, the present invention also is directed to some applications of the profile, no matter by directly analyzing the profile or by other way to utility the profile.

One embodiment provides a method for monitoring ion implantation. The method has at least the following steps. First, provide an ion beam and a workpiece. Next, implant the workpiece by the ion beam and generate a profile having numerous signals relevant to respectively numerous relative positions between the ion beam and the workpiece, wherein the profile has at least a higher portion, a gradual portion and a lower portion. Therefore, analyze the profile without referring to a pre-determined profile, so as to monitor the ion implantation much real-timely.

Another embodiment provides a method for monitoring ion implantation. The method has at least the following steps. First, provide an ion beam and numerous workpieces. Then, implant one or more workpieces by the ion beam in sequence. Herein, for each implanted workpiece, a profile having numerous signals relevant to respectively numerous relative positions between the ion beam and the workpiece is generated and analyzed without referring to a pre-determined profile. Herein, each generated profile has at least a higher portion, a gradual portion and a lower portion. Next, generate a reference being a function of these profiles corresponding to these implanted workpieces. After that, implant another workpiece by the ion beam and generate an another profile, wherein the another profile has numerous signals relevant to respectively numerous relative positions between the ion beam and the another workpiece, wherein the another profile has at least a higher portion, a gradual portion and a lower portion. And then, analyze the another profile without referring to the pre-determined profile to generate an analyzed result. Finally, compare the analyzed result of the another profile with the reference, so as to the variation of the ion beam, or the variation of the ion implantation, during a period of implanting these implanted workpieces and the another workpiece may be monitored much-timely.

In at least a specific embodiment, the profile may be a current curve formed with numerous current values measured at different relative positions by a Faraday cup close to the workpiece. In at least another specific embodiment, the profile may be a capacitance-related current curve formed with numerous capacitance-related current values measured at different relative positions by a capacitance meter electrically coupled with the workpiece.

In other specific embodiments, to monitor the ion beam quality and/or to improve the control of implanting the workpiece by the ion beam, at least one of the following steps may be performed: (a) calculate an ion beam width and/or an ion beam height of the ion beam according to a span of the gradual portion of the profile, even calculate an ion beam contour and/or an ion beam center by using the spans of many gradual portions generated on many scanning lines where the ion beam is scanned through the workpiece accordingly; (b) convert the gradual portion to generate a current distribution of the ion beam, even to adjust how the workpiece is scanned by the ion beam accordingly; (c) monitor whether there is any glitch on the profile or on the converted current distribution of the ion beam, even to adjust/stop the ion implantation accordingly; and (d) change the relative moving direction between the ion beam and the workpiece when all currently measured signals are located on the higher portion and fix the relative moving direction at least a currently measured signal is located on the gradual portion, even to assign at least a turn around point of at least a specific scanning line at a specific position wherein a distance between the specific position and an edge of the workpiece along the specific scanning line is essentially equal to a span of the gradual portion when said workpiece is scanned by said ion beam along a plurality scanning lines over said workpiece.

Still in other specific embodiments that numerous workpieces are implanted by the ion beam, at least one of the fowling steps may be performed: (a) after the reference is generate, implant other workpieces by the ion beam when the corresponding profile of each of the other workpieces is compared with the reference; (b) tune the ion beam whenever a difference between the analyzed result and the reference is un-acceptable, wherein the reference is updated by using the tuned ion beam and then other un-implanted workpieces are implanted and monitored by comparing the corresponding profile of each of the other un-implanted workpieces with the updated reference; (c) tune one or more ion implantation parameters whenever a difference between the analyzed result and the reference is un-acceptable, wherein the reference is updated by using the tuned ion beam and then other un-implanted workpieces are implanted and monitored by comparing the corresponding profile of each of the other un-implanted workpieces with the updated reference, wherein these implantation parameters may include ion beam energy, ion beam direction, ion beam diverse, position of a workpiece right be implanted by ion beam, and an alignment between ion beam and a workpiece right be implanted by the ion beam; and (d) compare the reference with a measured result measured by using a profiler to measure the ion beam, where these un-implanted workpieces will not be implanted if a difference between the reference and the measured result is un-acceptable.

Accordingly, how the workpiece is implanted by the ion beam may be monitored much real-timely, because the profile may be generated simultaneously during a period of implanting the workpiece by the ion beam. Moreover, by analyzing the profile, not only the quality of the ion beam may be further monitored but also how the workpiece is implanted by the ion beam may be further improved.

DETAILED DESCRIPTION OF THE INVENTION

Reference will now be made in detail to appended embodiments of the present invention. Examples of these embodiments are illustrated in the accompanying drawings. While the invention will be described in conjunction with these specific embodiments, it will be understood that it is not intended to limit the invention to these embodiments. In fact, it is intended to cover alternatives, modifications, and equivalents as may be included within the spirit and scope of the invention as defined by the appended claims. In the following description, numerous specific details are set forth in order to provide a through understanding of the present invention. The present invention may be practiced without some or all of these specific details. In other instances, well-known process operations are not described in detail in order not to obscure the present invention.

Figure 1:
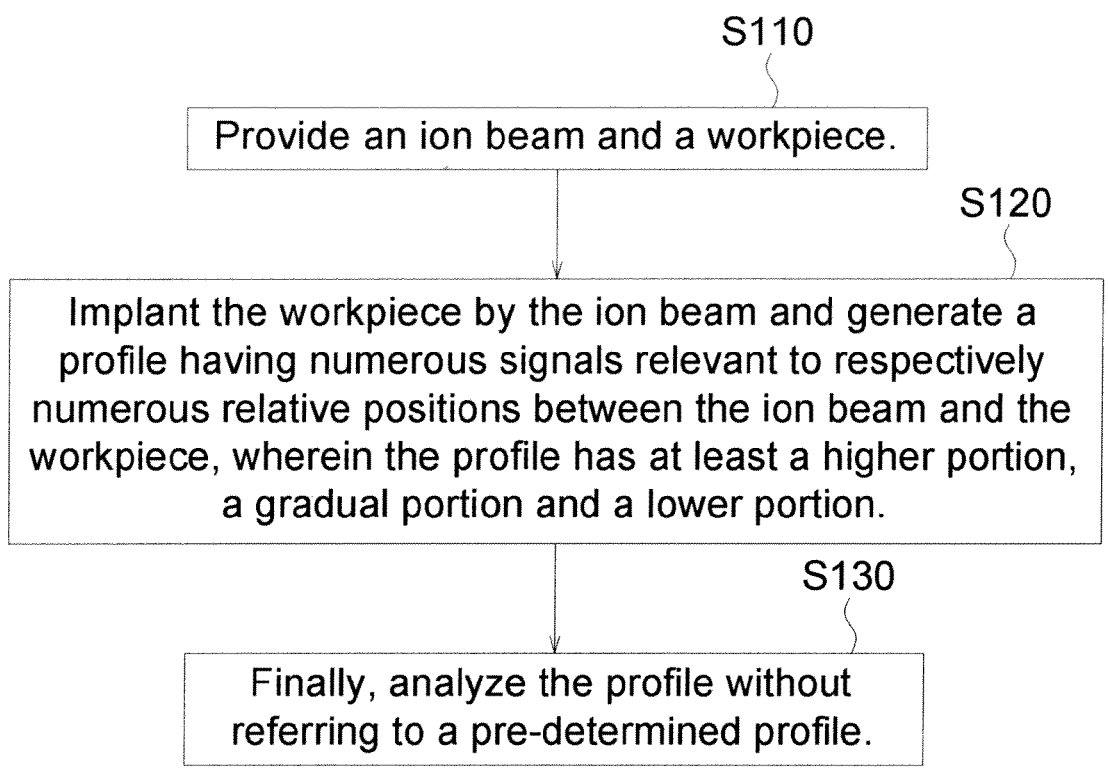
FIG. 1 illustrates a block diagram of a method for monitoring ion implantation according to an embodiment of the present invention.
Figure 2A:
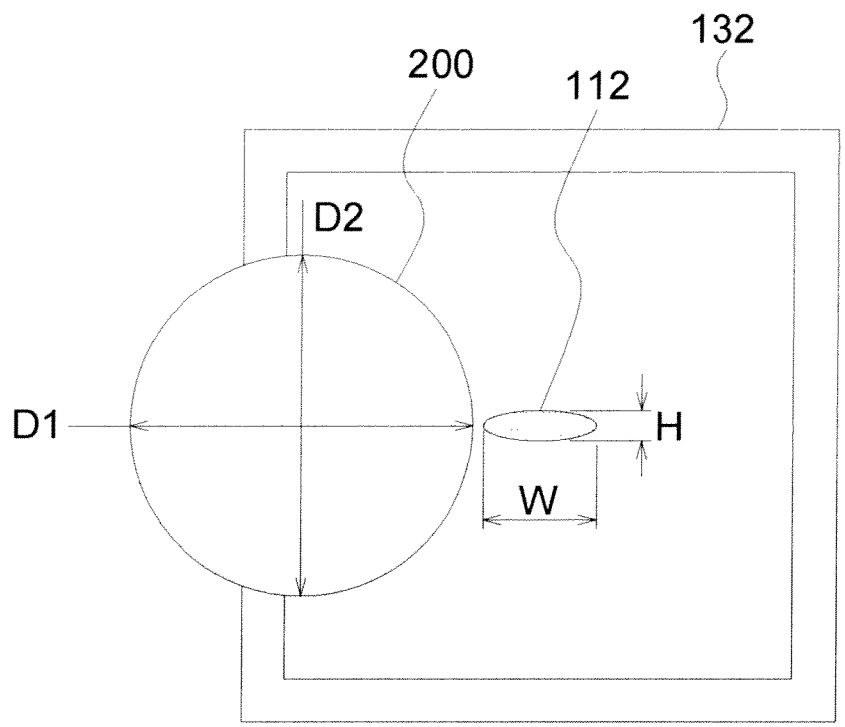
FIG. 2A to FIG. 2C illustrate respectively different relative positions between the ion beam and the workpiece during an implantation period according to an embodiment of the present invention.
Figure 2B:
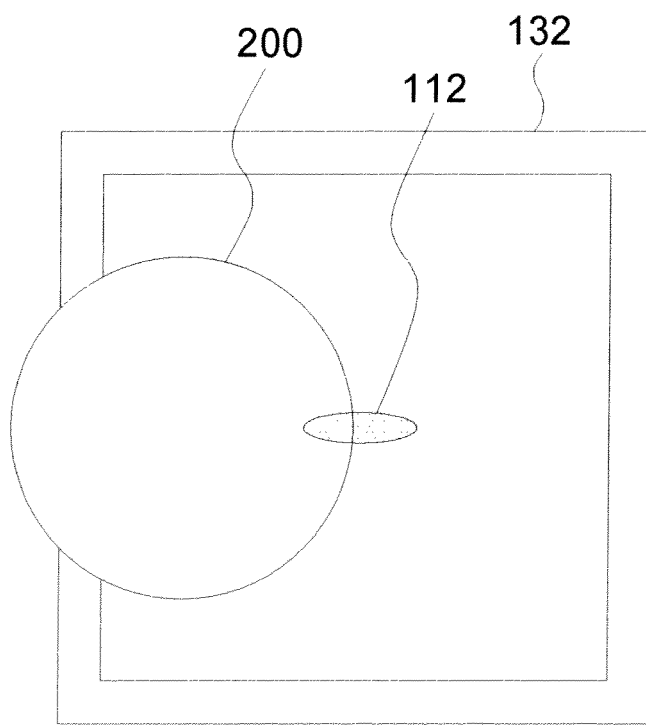
Figure 2C:
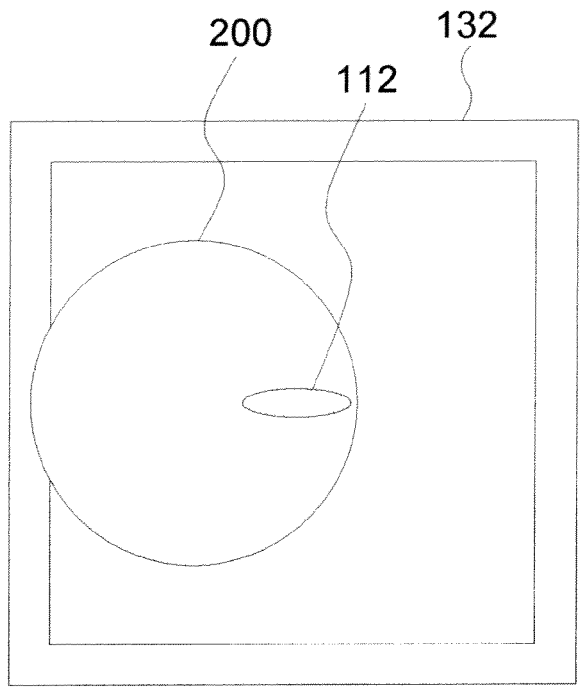
Figure 3:
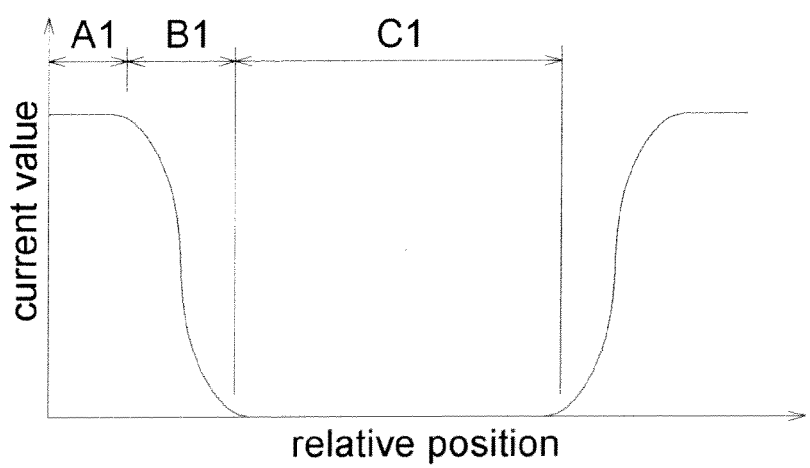
FIG. 3 illustrates a current curve relevant to the relative positions as illustrated in FIG. 2A to FIG. 2C.
Figure 4A:
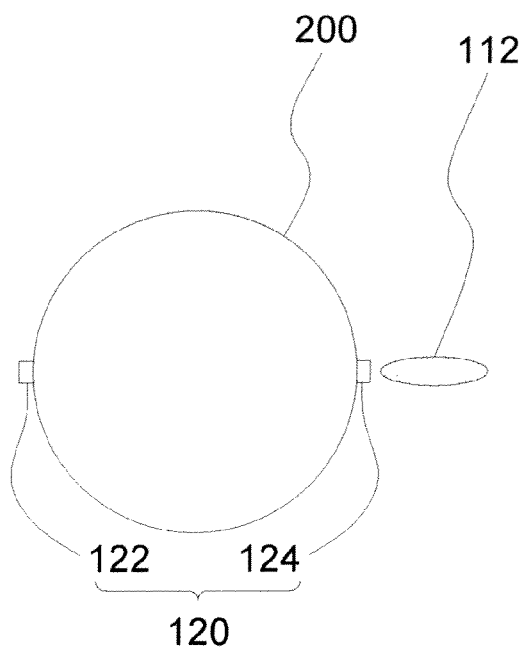
FIG. 4A to FIG. 4C illustrate respectively different relative positions between the ion beam and the workpiece during an implantation period according to another embodiment of the present invention.
Figure 4B:
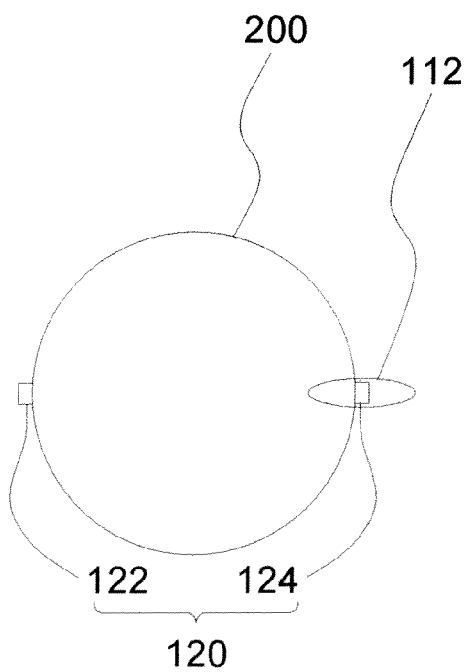
Figure 4C:
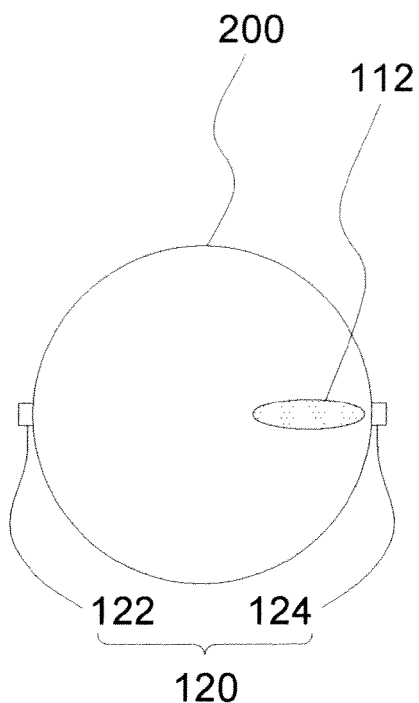
Figure 5:
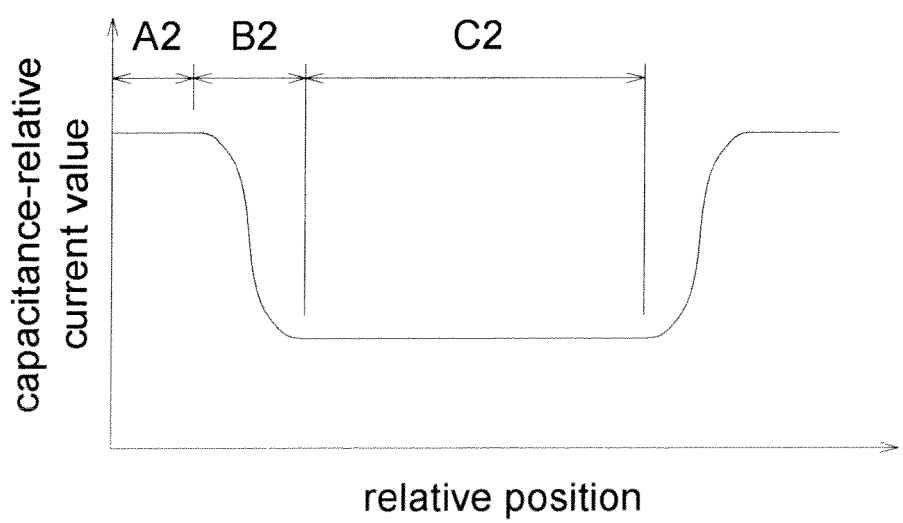
FIG. 5 illustrates a capacitance-related current curve relevant to the relative positions as illustrated in FIG. 4A to FIG. 4C.

FIG. 1 illustrates a block diagram of a method for monitoring ion implantation according to an embodiment of the present invention. FIG. 2A to FIG. 2C illustrate respectively different relative positions between the ion beam and the workpiece during an implantation period according to an embodiment of the present invention. FIG. 3 illustrates a current curve relevant to the relative positions as illustrated in FIG. 2A to FIG. 2C. FIG. 4A to FIG. 4C illustrate respectively different relative positions between the ion beam and the workpiece during an implantation period according to another embodiment of the present invention. In addition, FIG. 5 illustrates a capacitance-related current curve relevant to the relative positions as illustrated in FIG. 4A to FIG. 4C.

Referring to FIG. 1 first, the method for monitoring ion implantation according to an embodiment of the present invention comprises the following steps. First, provide an ion beam and a workpiece (S110). Next, implant the workpiece by the ion beam and generate a profile having numerous signals relevant to respectively numerous relative positions between the ion beam and the workpiece, wherein the profile has at least a higher portion, a gradual portion and a lower portion (S120). Finally, analyze the profile without referring to a pre-determined profile (S130). Note that the profile is generated during an implantation period of implanting the workpiece by the ion beam. Hence, the ion implantation may be monitored much real-timely.

In an embodiment, the profile is a current curve as illustrated in FIG. 3. The current curve is formed with numerous current values measured from a Faraday cup 132 close to the workpiece 200 at different relative positions between the ion beam 112 and the workpiece 200 as illustrated in FIG. 2A to FIG. 2C. In another embodiment, the profile is a capacitance-related current curve as illustrated in FIG. 5. The capacitance-related current curve is formed with numerous capacitance-related current values measured from a capacitance meter having two electrodes 122/124 electrically coupled with the workpiece 200 at different relative positions between the ion beam 112 and the workpiece 200 as illustrated in FIG. 4A to FIG. 4C.

In detail, referring to FIG. 2A and FIG. 3 first, when a relative position between the ion beam 112 and the workpiece 200 is as illustrated in FIG. 2A, whole the ion beam 112 is projected outside the workpiece 200 and may be projected on the Faraday cup 132. It means the ion beam 112 is not crossing an edge of the workpiece 200 at this time. Hence, a higher portion A1 with a substantially stable current value equal to a total current of the ion beam 112 as illustrated in FIG. 3 is measured.

And then referring to FIG. 2B and FIG. 3, when a relative position between the ion beam 112 and the workpiece 200 is as illustrated in FIG. 2B, a part of the ion beam 112 is projected on the workpiece 200, and the other part of the ion beam 112 may be projected on the Faraday cup 132. It means the ion beam 112 is crossing an edge of the workpiece 200 at this time. Hence, a gradual portion B1 as illustrated in FIG. 3 is measured, wherein a current value of the gradual portion B1 is varying with a ratio of the ion beam 112 projected on the workpiece 200. Reasonably, the gradual portion B1 is gradually decreasing when the overlap between the ion beam 112 and the workpiece 200 is gradually increasing. In other words, in other non-illustrated situation, other gradual value is gradually increasing when the overlap between the ion beam 112 and the workpiece 200 is gradually decreasing.

In addition, referring to FIG. 2C and FIG. 3, when a relative position between the ion beam 112 and the workpiece 200 is as illustrated in FIG. 2C, whole the ion beam 112 is projected on the workpiece. In other words, the ion beam 112 is not crossing an edge of the workpiece 200 at this time, too. Hence, a lower portion C1 with a substantially stable current value equal to 0 as illustrated in FIG. 3 is measured.

In the other embodiment, referring to FIG. 4A to FIG. 4C first, where the workpiece 200 is held by a chuck with two electrodes 122 and 124 positioned closed to two opposite sides of the chuck. Such design causes an equivalent capacitor formed between the electrode 122 and the edge of the workpiece 200, and also causes another equivalent capacitor formed between the electrode 124 and the edge of the workpiece 200. Thereafter, an original current may flow through the electrode 122, the workpiece 200 and the electrode 124 in sequences, so that a capacitance-related current may be measured by a capacitance meter electrically coupled with the workpiece 200. As usual, such design is used to monitor whether the workpiece 200 is held by the chuck exactly, because the capacitance of the two equivalent capacitors are dependent strongly on the relative positions between the workpiece 200 and the two electrodes 122/124. However, when at least partial ion beam 112 is projected on the workpiece 200, the electrons applied to neutralize the ion beam 112 (or the implanted workpiece 200), even the ions of the ion beam 112, may provide an additional current path to the original current, so that partial original current is grounded by the additional current path and then the measured capacitance-related current is degraded. Accordingly, the measured capacitance-related current will become a function of the relative position between the ion beam 112 and the workpiece 200, because at least the electrons for neutralizing are moved together with the ion beam 112.

Therefore, when a relative position between the ion beam 112 and the workpiece 200 is as illustrated in FIG. 4A, whole the ion beam 112 is projected outside the workpiece 200 and then a higher portion A2 substantially equal to the original current as illustrated in FIG. 5 is measured. And then referring to FIG. 4B and FIG. 5, when a relative position between the ion beam 112 and the workpiece 200 is as illustrated in FIG. 4B, a part of the ion beam 112 is projected on the workpiece 200 and then a gradual portion B2 as illustrated in FIG. 5 is measured. Clearly, at this time, the measured capacitance-related current value is decreased when the overlap ratio is increasing and then the grounded current is increased, in the versa. In addition, referring to FIG. 4C and FIG. 5, when a relative position between the ion beam 112 and the workpiece 200 is as illustrated in FIG. 4C, whole the ion beam 112 is projected on the workpiece and then a lower portion C2 as illustrated in FIG. 5 is measured. Herein, the lower portion C2 is substantially equal to a difference between the original current and the maximized grounded current.

Note that the profile in the present invention is not limited to have one or more gradual portions, also is not limited to be a U-shape profile, as illustrated in FIG. 3 and FIG. 5. Indeed, only the gradual portion corresponds to the situation that the ion beam is overlapped with an edge of the workpiece, and then the analysis on the gradual portion is more important and useful for monitoring how the workpiece is implanted by the ion beam. Hence, the number of the gradual portion and the contour of the profile may be flexibly adjusted. In a word, a higher portion, a decreasing gradual portion, a lower portion, an increasing gradual portion and another higher portion are measured in sequence in an ideal situation when the workpiece is scanned by the ion beam along a scan line. However, the ion beam may be interfered by a robot arm for moving the workpiece (or moving the chuck) through the ion beam or affected by other factor(s), so that the profile may have only a decreasing gradual portion or an increasing gradual increasing portion in practice. In some non-illustrated embodiments, when the workpiece is scanned by the ion beam back and forth, there are numerous profiles each corresponding to a scan path from a side of the workpiece through the workpiece surface to an opposite side of the workpiece one and only one time. In such case, an average profile, or an average gradual portion, acquired by averaging these profiles, or acquired by averaging these gradual portions, may be used as an equivalent profile (or equivalent gradual portion).

Accordingly, by monitoring the gradual portion B1 and/or B2, which is generated during a period that the ion beam 112 is crossing an edge of the workpiece 200, the ion beam projected on the workpiece 200 may be monitored much real-timely and then some application(s) of the measured profile may be performed much real-timely. Of course, the application(s) of the measured shape is not limited by the number of the gradual portion or by whether the gradual portion is increasing or decreasing. Every application may be achieved by using only a gradual portion, or by using an average of at least two gradual portions.

Figure 6A:
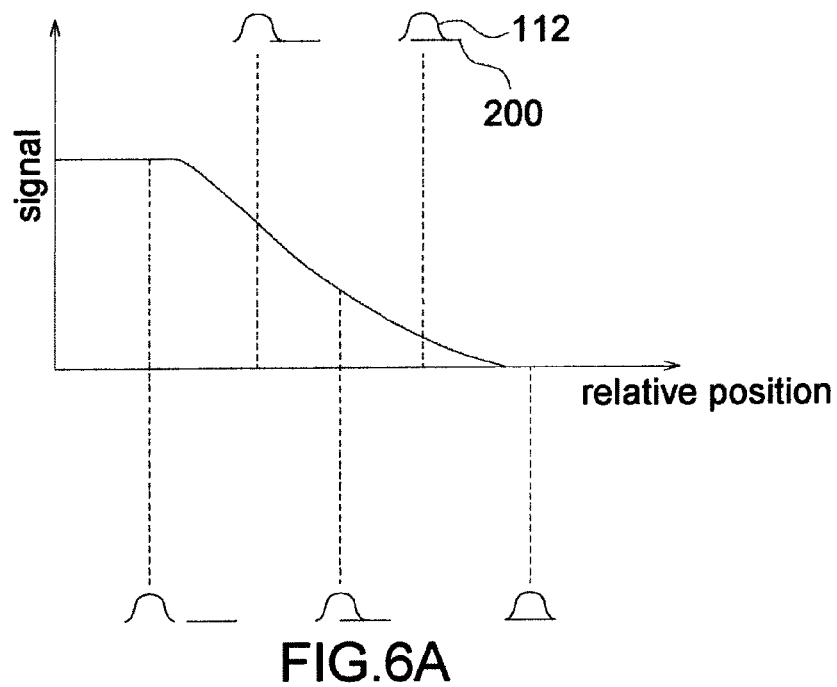
FIG. 6A to FIG. 6H illustrate four potential applications, where are related at least to how to monitor the ion beam quality and how to control the ion implantation.
Figure 6B:
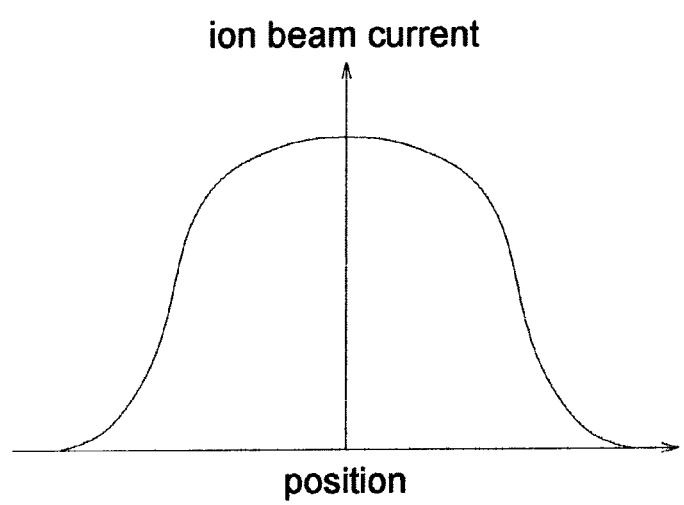

One application of the measured profile is converting the gradual portion to generate a current distribution of the ion beam 112 along an ion beam cross-section. FIG. 6A illustrates a relationship between the measured profile and the current distribution. As well-known, the current distribution current should have a peak close to the center of the ion beam cross-section area and is gradually decreased to the boundary of the ion beam cross-section. Hence, as the relationship shown in FIG. 6A, the measured profile corresponds to the higher portion when the ion beam cross-section is totally located outside the workpiece 200 (i.e., the ion beam 112 is totally projected outside the workpiece 200), the measured profile corresponds to the gradual portion when the ion beam cross-section is partially located inside the workpiece 200 (i.e., the ion beam 112 is moving through the edge of the workpiece 200), and the measured profile corresponds to the lower portion when the ion beam) cross-section is totally located inside the workpiece (i.e., the ion beam 112 is totally projected on the workpiece 200). Moreover, owing to the current distribution having gradual and non-linear shape, the variation of the gradual portion also has non-linear and gradual shape. Indeed, when the overlap ratio between the ion beam 112 and the workpiece 200 is gradually increased, the absolute value of the slope of the gradual portion is firstly increased and then decreased. Therefore, as shown in FIG. 6B, a current distribution may be converted from the measured profile, from at least a gradual portion of the measured profile. Accordingly, the ion beam current distribution among the cross-section of the ion beam 112 may be real-timely monitored during the implantation period of implanting the workpiece 200 by the ion beam 112 in a more real-timely manner. At most a short period of moving whole the ion beam 112 through the edge of the workpiece 200 is required to real-timely monitor the ion beam 12. In other words, after the ion beam 112 is provided before the implantation period, any variation of the ion beam 112 may be more real-timely monitored. To compare with these conventional approaches mentioned above, the application of the measured profile provides a more real-timely monitoring on the geometric messages of the ion beam. And then, both the adjustment on the ion beam before being implanted into the workpiece and these used parameters (such as the distance between the neighboring scan lines and the scan velocity along the scan path) may be efficiently monitored and adjusted.

Figure 6C:
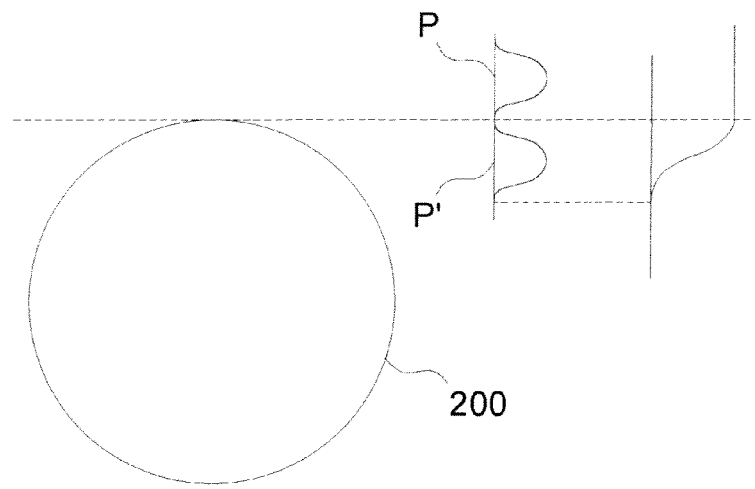
Figure 6D:
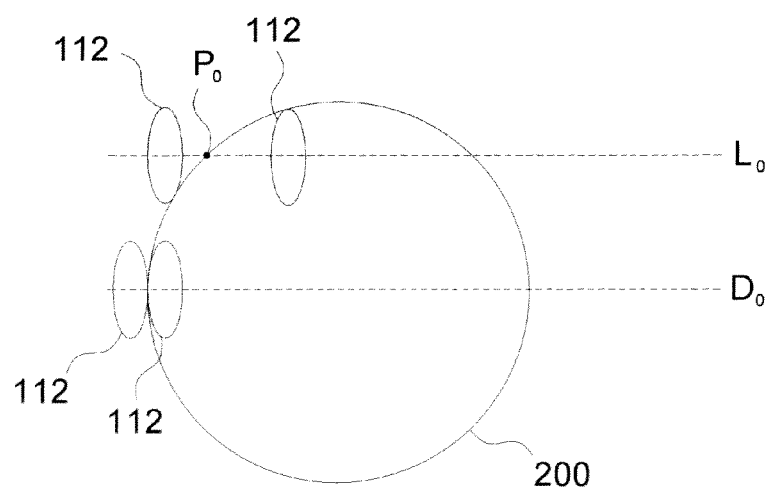

Another application of the measured profile is using the gradual portion to acquire the geometric messages of the ion beam 112. As discussed above and shown in FIG. 6C, the gradual portion is corresponding to the size of the ion beam 112 along a relative moving direction between the ion beam 112 and the workpiece 200. Therefore, by referring to FIG. 6C and FIG. 6D, when the relative moving direction is parallel to a minor axis of the ion beam 112 and the movement is overlapped a diameter D1 of the workpiece 200, an ion beam width W of the ion beam 112 may be acquired simply by measuring a span of the gradual portion. Alternatively, when the relative moving direction is parallel to a major axis of the ion beam 112 and the movement is overlapped with another diameter of the workpiece 200, an ion beam height H of the ion beam 112 may be acquired simply by measuring the span of the gradual portion along the used diameter. Another related application of the measured profile still is using the gradual portion to acquire the geometric messages of the ion beam 112. As shown in FIG. 6D, when the relative moving direction is parallel to a diameter of the workpiece 200 but the movement is not overlapped with the diameter (for example, the movement is overlapped with the line Lo parallel to the diameter Do), the variation of the measured profile is started before the ion beam 112 being overlapped with the cross point Po between Lo and the edge of the workpiece 200 and is not immediately finished after the ion beam 112 is not overlapped with the cross point Po. In other words, in such situation, the measured profile is a function of at least the size and the shape of the ion beam 112, the contour and the size of the workpiece 200 and the position of the line Lo. Accordingly, by scanning the workpiece 200 through the ion beam 112 along numerous lines respectively parallel to a direction (such as the direction parallel to the major axis of the ion beam 112) and numerous lines respectively parallel to another direction (such as the direction parallel to the minor axis of the ion beam 112), numerous different widths/heights corresponds to different lines are acquired. Therefore, as the converting mechanism introduced above (as shown in FIG. 6A and FIG. 6B), the contour of the ion beam 112 is calculated and then the ion beam width, the ion beam height and the center of the ion beam 112 on both directions may be acquired. After that, to compare with the initial contour or the ideal contour of the ion beam 112, an alignment between the ion beam 112 and the workpiece 200 may be adjusted, even the scan path of the ion bean 112 through the workpiece 200 may be adjusted, also the ion beam 112 may be adjusted by adjusting the operation of an ion source, a mass analyzer and/or a beam optics. To compare with these conventional approaches mentioned above, these applications of the measured profile provide a more real-timely monitoring on the current distribution on the ion beam cross-section. And then, the practical implanted dose on the implanted workpiece may be precisely monitored.

Figure 6E:
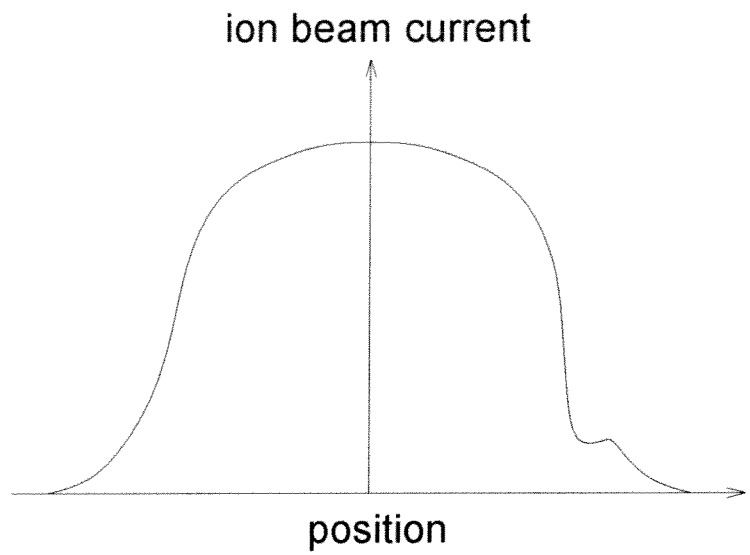
Figure 6F:
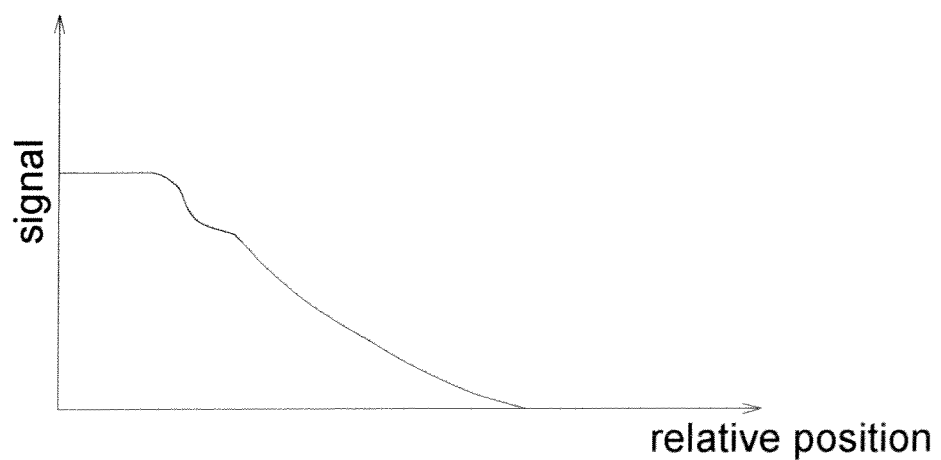

A further application of the measured profile is monitoring a variation of the ion beam 112 and providing a channel to prevent/improve improper ion implantation. As shown in FIG. 6E and FIG. 6F, no matter by monitoring the converted ion beam current distribution or by measuring the measured profile, any monitored glitch indicates an abnormal variation is happed. For example, the ion beam source may be unstable, sot that the ion beam current distribution is unstable. For example, the moving velocity of the workpiece may be not stable, so that the ion beam current projected into the workpiece is suddenly changed. Hence, by monitoring the appearance of any glitch, whether the workpiece 200 is properly implanted by the ion beam 112 may be real-timely monitored during the implantation period. Therefore, the ion implantation may be paused to avoid improper implantation on the workpiece 200, and the ion implanter and/or the implanting parameters may be modified and/or corrected accordingly. To compare with these conventional approaches mentioned above, the application of the measured profile provides a channel to real-timely monitoring the ion beam and/or the ion implantation by analyzing the measured profile itself. And then, the ion beam and/or the ion implantation may be flexibly adjusted.

Figure 6G:
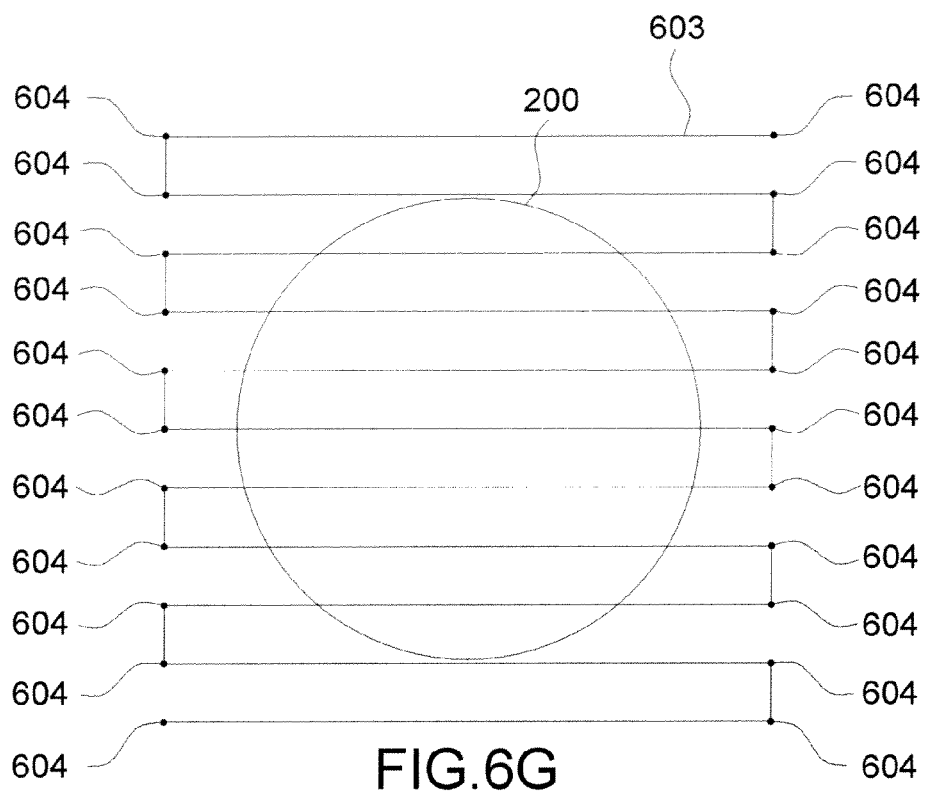
Figure 6H:
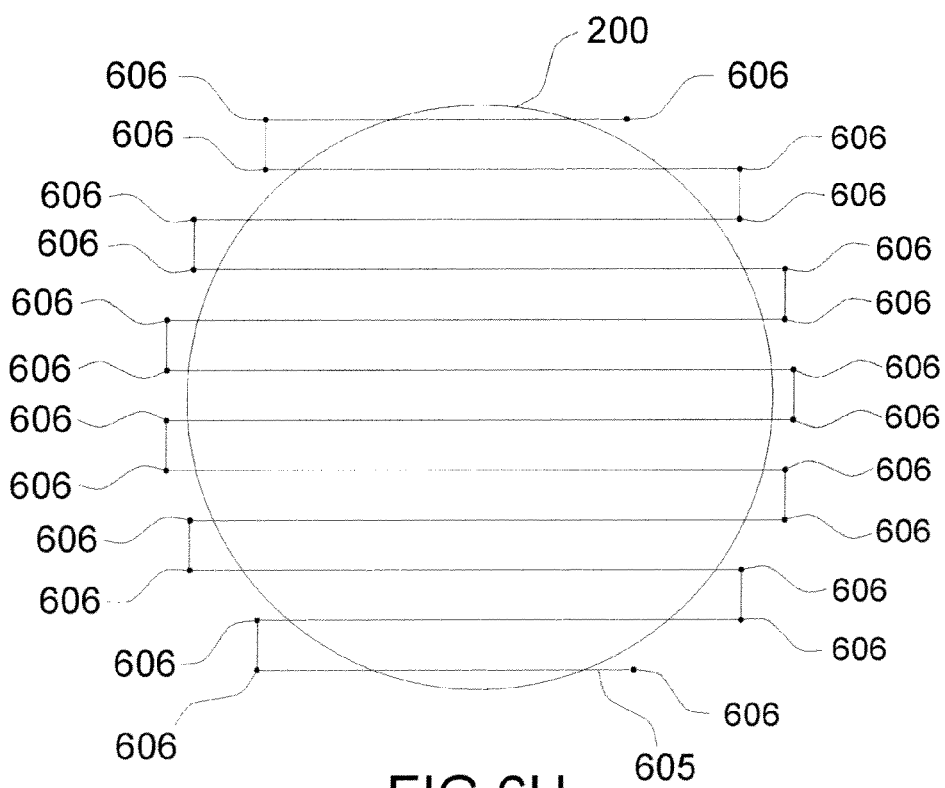

An optional application of the measured profile is to improving the efficiency of the ion implantation. In the prior art, as shown in FIG. 6G, the turn around points 604 are predetermined and assigned to be the some because the real relative position between the workpiece 200 and the ion beam 112 usually can not be real-timely monitored during the implantation period of scanning the ion beam through the workpiece 200 along the scan path 603. Hence, to minimize the risk of tuning the relative movement between the ion beam 112 and the workpiece 200 early and then improperly implanting the ion beam 112 to the workpiece 200, the safety distance between the edge of the workpiece 200 and each turn around point 604 along each scan line of the scan path 603 usually is significantly larger than the ion beam width W and/or the ion beam height H. Then, for the upper portion and lower portion shown in FIG. 6G, the distance between the turn around points and the edge of the workpiece 200 is significantly larger the ion beam size. Therefore, the required time to scan through these safety distances is larger, and then the waste time, even the waste ion beam 112, is un-avoidably increased. In contrast, in this invention, the measured profile is generated by scan the ion beam 112 through the workpiece 200 along a scan line of the scan path 603, and then the currently measured signals corresponds to the location of the ion beam 112 should be only a portion of the measured profile no matter the ion beam 112 is located on which portion of the scan line. Indeed, at least one of currently measured signals is located on the gradual region when the ion beam 112 is partially overlapped with the workpiece 200, all currently measured signals are located on the higher portion when the ion beam 112 does not overlapped with the workpiece 200, and all currently measured signals are located on the lower portion when the ion beam 112 is totally overlapped with the workpiece 200. Therefore, to move scan the ion beam 112 along a fixed scanning direction when the ion beam 112 is overlapped with the workpiece 200 and to change the scanning direction or to move to another scan line after the ion beam 112 is not overlapped with workpiece 200 with shorted safety distance, it is possible to change a relative moving direction between the ion beam 112 and the workpiece 200 when all currently measured signals are located on the higher portion and to fix the relative moving direction when at least a currently measured signal is located on the gradual portion. Further, when the workpiece 200 is scanned by the ion beam 112 along numerous scanning lines over the workpiece 200, at least a turn around point of at least a specific scanning line may be assigned at a specific position wherein a distance between the specific position and an edge of the workpiece 200 along the specific scanning line is essentially equal to a span of the gradual portion. Accordingly, as shown in FIG. 6H, the safety distance between each turn around point and the edge of the workpiece 200 may be reduced to be almost equal to the ion beam size. And then, the waste time, even the waste ion beam 112, may be minimized.

In addition, the measurement of the profile may meet some troubles in the real world. For example, the noise may induce the measured values at different relative positions oscillated, especially oscillates at the gradual portion where the measured value should be clearly changed among different relative positions. Moreover, sometimes, at least one relative position(s) has no proper measured value owing to improper measurement or other reasons. Therefore, in an embodiment, the measured profile may be modified by using an N-points smoothing process, wherein N is a positive integer, so that a modified profile has measured value(s) at all relative positions and then the above applications may be performed more easily and effectively. Furthermore, in another embodiment, when at least one specific relative position(s) has no proper measured signal, a correcting process may be performed to modify the measured profile. Herein, the correcting process may have at least one of following approaches. One approach is generating the profile by only these signals measured at other relative positions, i.e. any relative position with no proper sign are skipped. Another approach is generating a pseudo signal for each specific relative position by extrapolating from at least two signals measured at other relative positions, and then generating the profile by both these measured signals and the pseudo signal. One another approach is generating a pseudo signal for each specific relative position by interpolating from at least two signals measured at other relative positions, and then generating the profile by both these measured signals and the pseudo signal.

The above embodiments are focused on how to real-timely monitor the ion implantation on a signal workpiece, also on some applications about how to efficiently handle the ion beam and adjust the ion implantation. However, some other embodiments may be used to more real-timely monitor the ion implantation of numerous workpieces, especially to monitor these workpieces by using only the monitoring results of these workpieces. As usual, a lot of workpieces may be implanted by using the same implantation parameters to form same implant region on each implanted workpiece. It is a natural requirement of the mass production. Therefore, after one or more of these workpieces are implanted and monitored by the above embodiments in sequence, at least the geometric messages of the ion beam acquired from these corresponding measured profile may be used to establish a reference. Then, during the implantation of the other workpieces from the same lot, the reference may be used to determine whether the practical implantation parameters; values are varied.

Figure 7:
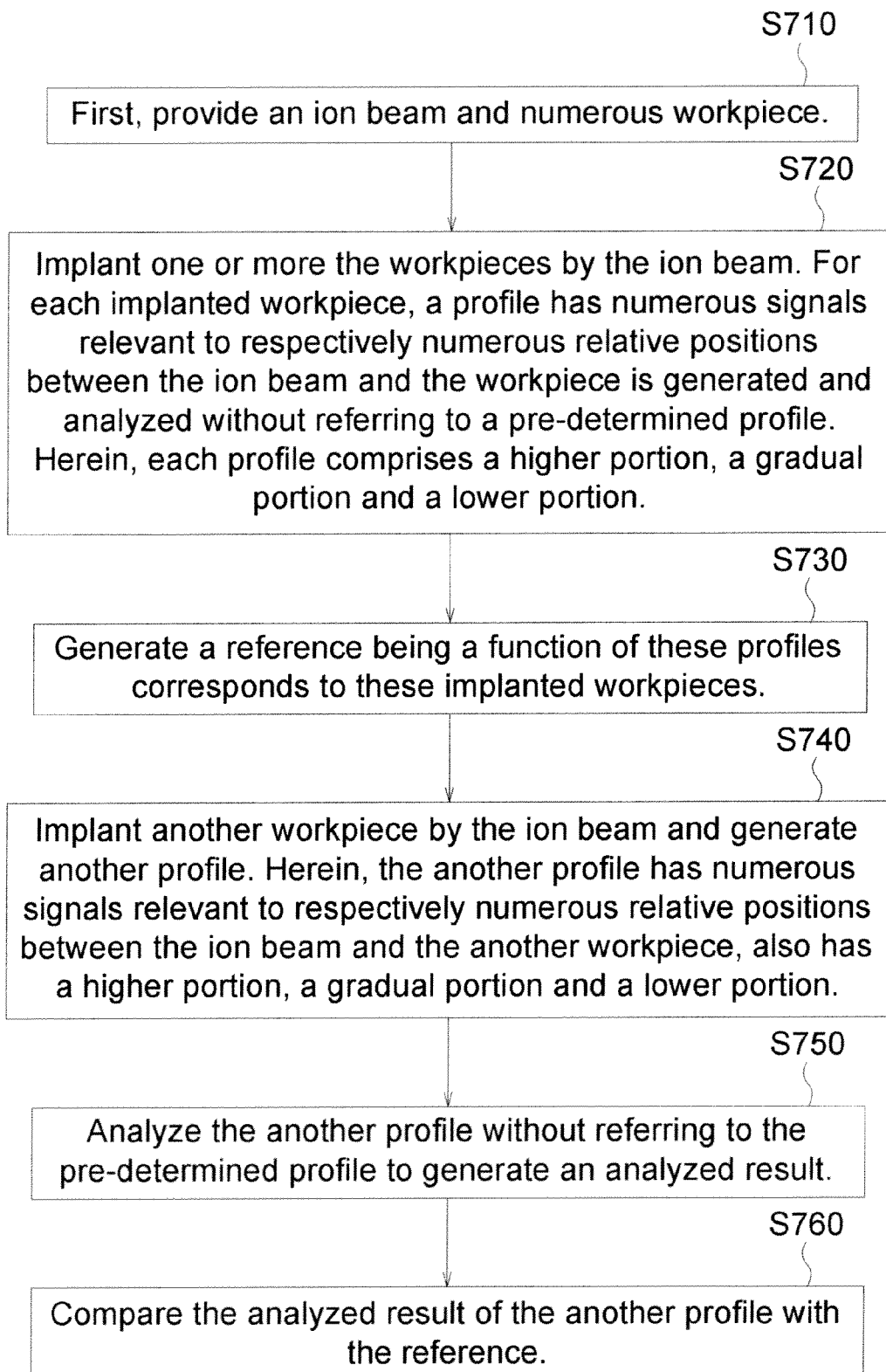
FIG. 7 illustrates a block diagram of a method for monitoring ion implantation according to another embodiment of the present invention.

Referring to FIG. 7 first, the method for monitoring ion implantation according to an embodiment of the present invention comprises the following steps. First, provide an ion beam and numerous workpiece (S710). Then, implant one or more the workpieces by the ion beam. For each implanted workpiece, a profile has numerous signals relevant to respectively numerous relative positions between the ion beam and the workpiece is generated and analyzed without referring to a pre-determined profile. Herein, each profile comprises a higher portion, a gradual portion and a lower portion (S720). Next, generate a reference being a function of these profiles corresponds to these implanted workpieces (S730). And then, implant another workpiece by the ion beam and generate another profile. Herein, the another profile has numerous signals relevant to respectively numerous relative positions between the ion beam and the another workpiece, also has a higher portion, a gradual portion and a lower portion (S740). After that, analyze the another profile without referring to the pre-determined profile to generate an analyzed result (S750). Finally, compare the analyzed result of the another profile with the reference (S760).

Of course, all implantation parameters' values should be assigned initially before the step (710) and all these workpiece should be arranged to have the same implant result if each workpiece is implanted perfectly. Hence, the difference between the reference and the analyzed result of the another profile may be used to determine whether the practical implant result on the another workpiece is similar with the practical implant result(s) on these workpieces implanted before. However, in the real world, the implantation on these workpiece may be imperfect. The ion beam current may be varied during a period of implanting these workpieces, the motor used to drive each workpiece through the ion beam may be unstable during the period of implanting these workpiece, and so on. Therefore, after the Step (760), the embodiment may have some optional variations. Of course, all these optional variations may be used independently or mixed.

One optional variation is repeating step (S740), step (S750) and step (S760) in sequence until all these workpieces are implanted by the ion beam. In other words, after one or more workpiece is used to build a reference, all other workpieces are implanted by the ion beam in sequence. Besides, for each workpiece implanted after the reference being built, a measured profile is acquired and analyzed as discussed in the above embodiments. Hence, for each workpiece implanted after the reference being built, by comparing the analyzed result of the corresponding profile with the reference, the practical implant result may be real-timely monitored without further analyzing the implanted workpiece after the ion implantation. For example, when both the reference and the analyzed result are the ion beam height, the ion beam width, the ion beam center (no matter the X-axis center or on the Y-axis center), the reference may be used to decide the acceptable ion beam shape/contour range. Then, whether the analyzed result of each workpiece implanted later is located in the acceptable ion beam shape/contour range provide a good index on the implant result of these workpieces implanted later.

Another optional variation is repeating step (S740), step (S750) and step (S760) in sequence until a difference between the reference and the analyzed result of a specific workpiece is un-acceptable (such as the difference is larger than a threshold). In such condition, as usual, the ion beam current or the ion beam shape is significantly varied. Hence, the ion beam is tuned before implanting other workpiece(s). Note that the tuned ion beam may be not thoroughly equal to the original ion beam, although both are qualified enough to implant these workpieces. Hence, the step (S720) and the step (S730) may be performed again to update the reference, i.e., to generate a new reference. After that, steps (S740), (S750) and (S760) may be repeated in sequence for other workpieces not yet implanted. Of course, when a difference between the updated reference and the analyzed result of another specific workpiece un-acceptable, the updated reference may be updated again before other un-implanted workpieces are implanted later. Of course, there are other potential reasons may induce the un-acceptable difference. For example, the driving mechanism used to move and rotate the workpiece may by un-stably operated, and the alignment between the ion beam and the workpiece to be implanted may be varied. Hence, other similar variation may tune the operation of the driving mechanism or tune the alignment, even to tune one or more ion implantation parameters, but not only tune the ion beam.

As an example, the implantation parameter may be at least one of the following: ion beam energy, ion beam direction, ion beam diverse, position of a workpiece right is implanted by the ion beam, and an alignment between the ion beam and a workpiece right is implanted by the ion beam, and so on.

Still another optional variation is comparing the reference with a measured result measured by using a profiler to measure the ion beam, and then processed steps (S740), (S750), and (S760) in sequence only when a difference between the reference and the measured result is acceptable. The profile is a popular and exact method to measure the ion beam, but it may be not real-timely enough. Hence, the optional variation uses the profile to check whether the reference is exact enough, and then uses the reference to monitor the implantation on the other workpieces in a more real-timely manner.

In these embodiment capable of monitoring numerous workpieces, the step (S720) and the step (S730) are similar with these embodiments capable of real-timely monitoring a workpiece. Hence, the details are not disclosed and discussed again, but only main contents may be used are described as the following: (a) The reference may be an average current distribution along an ion beam cross-section acquired by averaging one or more current distributions where each is converted from a gradual value of a profile. (b) The reference is an average ion beam geometric message acquired by averaging one or more ion beam geometric messages of these profiles, wherein the ion beam geometric messages may be an ion beam contour, an ion beam height, an ion beam width, and an ion beam center. (c) The ion beam width may be a span of a gradual portion of a profile when a relative moving direction between the ion beam and the workpiece coincides with a minor axis of the ion beam and crosses a diameter of the workpiece, the ion beam height may be a span of a gradual portion of a profile when the relative moving direction coincides with a major axis of an ion beam and crosses a diameter of a workpiece, and the ion beam contour and the ion beam center may be converted from numerous ion beam widths as a function of vertical position and numerous ion beam heights as a function of horizontal position which are acquired by scanning the workpiece through the ion beam along numerous first lines parallel to a specific diameter of the workpiece and along numerous second lines vertical to the specific diameter of the workpiece. (d) Use a Faraday cup close to the workpiece to measure numerous current values at these relative positions, so that at least one profile is formed as a current curve. (e) Use a capacitance meter electrically coupled with the workpiece to measure numerous capacitance-related current values at there relative positions, so that at least one profile is formed as a capacitance-related current curve.

In summary, the invention proposes a method for monitoring ion implantation. During a period of scanning an ion beam through a workpiece, numerous signals are measured at different relative positions between the ion beam and the workpiece by a Faraday cup, a capacitance meter, or even other devices. Depends on the overlap ratio between the ion beam and the workpiece, the profile has at least a higher portion, a gradual portion and a lower portion. After that, by directly analyzing the profile without referring to a pre-determined profile, the ion implantation may be monitored in a much real-time manner. For example, by using the span of the gradual portion, and by using the relative motion messages, at least one of the ion beam width, the ion beam height, the contour and the center of the cross-section of the ion beam may be found out. For example, because the profile is a function of both the ion beam current implanted into the workpiece and the relative position between the workpiece and the ion beam, by converting the profile, an ion beam current distribution among the cross-section of the ion beam may be found. In addition, the ion beam may be adjusted or terminated when at least one glitch is appeared on the profile or the current distribution. Furthermore, the turn around point of each scanning line of a scan path may be adjusted flexibly and precisely by using ion beam width/width corresponding to the span of the gradual portion.

Although specific embodiments of the present invention have been described, it will be understood by those of skill in the art that there are other embodiments that are equivalent to the described embodiments. Accordingly, it is to be understood that the invention is not to be limited by the specific illustrated embodiments, but only by the scope of the appended claims.

What is claimed is:

1. A method for monitoring ion implantation, comprising:
providing an ion beam and a workpiece;
implanting said workpiece by said ion beam and generating a profile having a plurality of signals relevant to respectively a plurality of relative positions between said ion beam and said workpiece when said ion beam is scanned through said workpiece, wherein said profile comprises a higher portion, a gradual portion and a lower portion, a width of said ion beam is acquired by measuring a span of said gradual portion when a relative moving direction between said ion beam and said workpiece coincides with a minor axis of said ion beam and crosses a diameter of said workpiece, and a height of said ion beam is acquired by measuring a span of said gradual portion when said relative moving direction coincides with a major axis of said ion beam and crosses said diameter of said workpiece; and
analyzing said profile without referring to a pre-determined profile, wherein at least one of the following of said ion beam is monitored: a beam contour of said ion beam and a current distribution of said ion beam along an ion beam radial cross-section.

2. The method as claimed in claim 1, said profile being a current curve formed with a plurality of current values measured at said relative positions by a Faraday cup close to said workpiece.

3. The method as claimed in claim 1, said profile being a capacitance-related current curve formed with a plurality of capacitance-related current values measured at said relative positions by a capacitance meter electrically coupled with said workpiece.

4. The method as claimed in claim 1, further comprising scanning said workpiece by said ion beam along a plurality of first lines parallel to a specific diameter of said workpiece and along a plurality of second lines vertical to said specific diameter of said workpiece, such that a plurality of widths as a function of vertical position and a plurality of heights as a function of horizontal position are found respectively and then at least a contour and a center of a cross-section of said ion beam are converted accordingly.

5. The method as claimed in claim 1, further comprising converting said gradual portion to generate said current distribution of said ion beam along said ion beam radial cross-section.

6. The method as claimed in claim 1, further comprising using an N-points smoothing process to modify said profile, wherein N is a positive integer.

7. The method as claimed in claim 1, further comprising performing a correcting process to modify said profile when at least one specific said relative position has no proper measured said signal, said correcting process comprising at least one of following:

generating a pseudo signal for each said specific relative position by extrapolating from at least two said signals measured at other said relative positions, and then generating said profile by both said signals and said pseudo signal; and generating a pseudo signal for each said specific relative position by interpolating from at least two said signals measured at other said relative positions, and then generating said profile by both said signals and said pseudo signal.

8. A method for monitoring ion implantation, comprising:
(a) providing an ion beam and a plurality of workpieces;
(b) implanting one or more said workpieces by said ion beam, wherein a profile having a plurality of signals relevant to respectively a plurality of relative positions between said ion beam and a said workpiece is generated when said ion beam is scanned through said workpiece, and said profile is analyzed without referring to a pre-determined profile for each implanted said workpieces, wherein each said profile comprises a higher portion, a gradual portion and a lower portion, wherein at least one of the following of said ion beam is monitored: a beam contour of said ion beam and a current distribution of said ion beam along an ion beam radial cross-section;
(c) generating a reference being a function of said profiles corresponding to implanted said workpieces, wherein said reference is an average ion beam geometric message acquired by averaging one or more ion beam geometric messages of said profiles, and said ion beam geometric messages has at least one of the following: said ion beam contour, an ion beam height, an ion beam width and an ion beam center of said ion beam, wherein said ion beam width is acquired by measuring a span of said gradual portion of a said profile when a relative moving direction between said ion beam and said workpiece coincides with a minor axis of said ion beam and crosses a diameter of said workpiece, said ion beam height is acquired by measuring a span of said gradual portion of a said profile when said relative moving direction coincides with a major axis of said ion beam and crosses said diameter of said workpiece, and said ion beam contour and said ion beam center are converted from a plurality of said ion beam widths as a function of vertical position and a plurality of said ion beam heights as a function of horizontal position which are acquired by scanning said workpiece through said ion beam along a plurality of first lines parallel to a specific diameter of said workpiece and along a plurality of second lines vertical to said specific diameter of said workpiece;
(d) implanting another one of said workpieces by said ion beam and generating an another profile when said ion beam is scanned through said another one of said workpieces, wherein said another profile having a plurality of signals relevant to respectively a plurality of relative positions between said ion beam and said another one of said workpieces, wherein said another profile comprises a higher portion, a gradual portion and a lower portion;
(e) analyzing said another profile without referring to said pre-determined profile to generate an analyzed result, wherein at least one of the following of said ion beam is monitored: said beam contour of said ion beam and said current distribution of said ion beam along said ion beam radial cross-section; and
(f) comparing said analyzed result of said another profile with said reference.

9. The method as claimed in claim 8, further comprising one or more of the following:

repeating step (d), step (e) and step (f) in sequence until all said workpieces are implanted by said ion beam;

tuning said ion beam whenever a difference between said analyzed result and said reference is un-acceptable, wherein said reference is updated by performing step (b) and step (c) again after said ion beam being tuned and before step (d), step (e) and step (f) being repeated in sequence for at least a said workpiece not yet implanted;

tuning one or more ion implantation parameters whenever a difference between said analyzed result and said reference is un-acceptable, wherein said reference is updated by performing step (b) and step (c) again after one or more ion implantation parameters being adjusted and before step (d), step (e) and step (f) being repeated in sequence for at least a said workpiece not yet implanted, wherein said implantation parameters comprise: an ion beam energy, an ion beam direction, an ion beam diverse, a position of a said workpiece being implanted by said ion beam, and an alignment between said ion beam and a said workpiece being implanted by said ion beam; and comparing said reference with a measured result measured by using a profiler to measure said ion beam after step (c), wherein step (d), step (e) and step (f) are not processed when a difference between said reference and said measured result is un-acceptable.

10. The method as claimed in claim 8, wherein said reference is an average current distribution along said ion beam radial cross-section acquired by averaging one or more said current distributions where each is converted from a said gradual value of a said profile.

11. The method as claimed in claim 9, further comprising one or more of the following:

using a Faraday cup close to said workpiece to measure a plurality of current values at said relative positions, so that at least one said profile is formed as a current curve; and using a capacitance meter electrically coupled with said workpiece to measure a plurality of capacitance-related current values at said relative positions, so that at least one said profile is formed as a capacitance-related current curve.

12. A method for monitoring ion implantation, comprising:
providing an ion beam and a workpiece;
implanting said workpiece by said ion beam and generating a profile having a plurality of signals relevant to respectively a plurality of relative positions between said ion beam and said workpiece when said ion beam is scanned through said workpiece, wherein said profile comprises a higher portion, a gradual portion and a lower portion;
analyzing said profile without referring to a pre-determined profile, wherein at least one of the following of said ion beam is monitored: a beam contour of said ion beam and a current distribution of said ion beam along an ion beam radial cross-section; and
scanning said workpiece by said ion beam along a plurality of first lines parallel to a specific diameter of said workpiece and along a plurality of second lines vertical to said specific diameter of said workpiece, such that a plurality of widths as a function of vertical position and a plurality of heights as a function of horizontal position are found respectively and then at least a contour and a center of a cross-section of said ion beam are converted accordingly.

13. The method as claimed in claim 12, said profile being a current curve formed with a plurality of current values measured at said relative positions by a Faraday cup close to said workpiece.

14. The method as claimed in claim 12, said profile being a capacitance-related current curve formed with a plurality of capacitance-related current values measured at said relative positions by a capacitance meter electrically coupled with said workpiece.

15. The method as claimed in claim 12, wherein a width of said ion beam is acquired by measuring a span of said gradual portion when a relative moving direction between said ion beam and said workpiece coincides with a minor axis of said ion beam and crosses a diameter of said workpiece, and a height of said ion beam is acquired by measuring a span of said gradual portion when said relative moving direction coincides with a major axis of said ion beam and crosses said diameter of said workpiece.

16. The method as claimed in claim 12, further comprising converting said gradual portion to generate said current distribution of said ion beam along said ion beam radial cross-section.

17. The method as claimed in claim 12, further comprising using an N-points smoothing process to modify said profile, wherein N is a positive integer.

18. The method as claimed in claim 12, further comprising performing a correcting process to modify said profile when at least one specific said relative position has no proper measured said signal, said correcting process comprising at least one of following:

generating a pseudo signal for each said specific relative position by extrapolating from at least two said signals measured at other said relative positions, and then generating said profile by both said signals and said pseudo signal; and generating a pseudo signal for each said specific relative position by interpolating from at least two said signals measured at other said relative positions, and then generating said profile by both said signals and said pseudo signal.

\* \* \* \* \*